United States Patent
Ramalingam et al.

(10) Patent No.: US 7,141,448 B2
(45) Date of Patent: Nov. 28, 2006

(54) CONTROLLED COLLAPSE CHIP CONNECTION (C4) INTEGRATED CIRCUIT PACKAGE WHICH HAS TWO DISSIMILAR UNDERFILL MATERIALS

(75) Inventors: Suresh Ramalingam, Fremont, CA (US); Venkatesan Murali, San Jose, CA (US); Duane Cook, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 545 days.

(21) Appl. No.: 09/874,666

(22) Filed: Jun. 5, 2001

(65) Prior Publication Data

US 2002/0017728 A1 Feb. 14, 2002

Related U.S. Application Data

(62) Division of application No. 09/261,849, filed on Mar. 3, 1999.

(51) Int. Cl.
*H01L 21/00* (2006.01)
*H01L 21/44* (2006.01)
*H01L 21/48* (2006.01)
*H01L 21/50* (2006.01)

(52) U.S. Cl. .................... 438/64; 438/106; 438/117

(58) Field of Classification Search ............ 438/67, 438/106, 117; 29/25.01
See application file for complete search history.

(56) References Cited

U.S. PATENT DOCUMENTS

| | | | |
|---|---|---|---|
| 4,322,737 A | 3/1982 | Silwa, Jr. | |
| 5,321,583 A | 6/1994 | McMahon | |
| 5,371,325 A | 12/1994 | Kalola et al. | |
| 5,371,328 A | 12/1994 | Gutierrez et al. | |
| 5,390,082 A * | 2/1995 | Chase et al. | 361/783 |
| 5,505,777 A * | 4/1996 | Ciardella et al. | 118/302 |
| 5,629,566 A | 5/1997 | Doi et al. | |
| 5,751,556 A | 5/1998 | Butler et al. | |
| 5,766,982 A | 6/1998 | Akram et al. | |
| 5,804,771 A | 9/1998 | McMahon et al. | |
| 5,811,317 A * | 9/1998 | Maheshwari et al. | 29/827 |
| 5,815,372 A | 9/1998 | Gallas | |
| 5,817,542 A | 10/1998 | Sakemi | |
| 5,821,456 A | 10/1998 | Wille et al. | |
| 5,864,178 A | 1/1999 | Yamada et al. | |
| 5,880,017 A | 3/1999 | Schwiebert et al. | |
| 5,891,753 A | 4/1999 | Akram | |

(Continued)

FOREIGN PATENT DOCUMENTS

EP 0340492 11/1989

(Continued)

OTHER PUBLICATIONS

"Shin-Etsu Liquid Coating Materials for Electronic Devices KJR Series and SEMICOAT Series", Nov. 1, 1998, pp. 8-14.*

(Continued)

*Primary Examiner*—David E. Graybill
(74) *Attorney, Agent, or Firm*—Blakely, Sokoloff, Taylor & Zafman LLP

(57) ABSTRACT

An integrated circuit package which may include the dispense of a second encapsulant material (or fillet) different from the first underfill material on an integrated circuit package which may include an integrated circuit that is mounted to a substrate. The package may further have a first underfill material and a second underfill material that are attached to the integrated circuit and the substrate. The second encapsulant material may be tailored to inhibit cracking of the epoxy itself that propagates into the substrate during thermo-mechanical loading.

13 Claims, 2 Drawing Sheets

U.S. PATENT DOCUMENTS

| | | | |
|---|---|---|---|
| 5,906,682 A * | 5/1999 | Bouras et al. ............... 118/323 |
| 5,917,702 A | 6/1999 | Barrow |
| 5,919,329 A | 7/1999 | Banks et al. |
| 5,920,120 A | 7/1999 | Webb et al. |
| 5,936,304 A | 8/1999 | Lii et al. |
| 5,942,805 A | 8/1999 | Winer et al. |
| 5,953,814 A | 9/1999 | Sozansky et al. |
| 5,956,814 A | 9/1999 | Choi |
| 5,959,362 A | 9/1999 | Yoshino |
| 5,965,937 A | 10/1999 | Chiu et al. |
| 5,973,930 A | 10/1999 | Ikeda et al. |
| 5,981,313 A | 11/1999 | Tanaka |
| 5,990,552 A | 11/1999 | Xie et al. |
| 5,991,161 A | 11/1999 | Samaras et al. |
| 5,998,242 A | 12/1999 | Kirkpatrick et al. |
| 6,001,703 A | 12/1999 | Winer et al. |
| 6,015,722 A * | 1/2000 | Banks et al. ................. 438/108 |
| 6,017,983 A * | 1/2000 | Gilleo ......................... 156/330 |
| 6,020,579 A * | 2/2000 | Lewis et al. ................. 219/696 |
| 6,049,122 A | 4/2000 | Yoneda |
| 6,049,124 A | 4/2000 | Raiser et al. |
| 6,057,381 A | 5/2000 | Me et al. |
| 6,104,093 A * | 8/2000 | Caletka et al. ............... 257/706 |
| 6,121,358 A * | 9/2000 | Dershem et al. ............. 252/513 |
| 6,166,434 A * | 12/2000 | Desai et al. .................. 257/704 |
| 6,201,301 B1 * | 3/2001 | Hoang ......................... 257/712 |
| 6,238,948 B1 * | 5/2001 | Ramalingam ............... 438/106 |
| 6,331,446 B1 * | 12/2001 | Cook et al. .................. 438/106 |
| 6,376,906 B1 * | 4/2002 | Asai et al. .................... 257/698 |
| 2002/0014688 A1 * | 2/2002 | Ramalingam et al. ....... 257/686 |
| 2002/0017728 A1 * | 2/2002 | Ramalingam et al. ....... 257/782 |

FOREIGN PATENT DOCUMENTS

| | | |
|---|---|---|
| EP | 0778616 A2 | 11/1997 |
| EP | 0908499 A1 | 4/1999 |
| JP | 63239827 | 10/1988 |
| JP | 02056941 | 2/1990 |
| JP | 03040458 | 2/1991 |
| JP | 03041146 | 2/1991 |
| JP | 07078616 | 3/1995 |
| JP | 08153830 | 6/1996 |
| JP | 10055832 | 2/1998 |
| JP | 10107082 | 4/1998 |

OTHER PUBLICATIONS

"Bynel Adhesive Resin, Series 1100 Including 1123, 1124, and 11E573 Modified Ethylene Vinyl Acetate, Adhesive Evaluation." 2003: n. pag. Dupont Sep. 27, 2003 <http://www.dupont.com/industrial-polymers/bynel/H-68911/H-68911.html>.*

"Standard Test Method for Peel or Stripping Strength of Adhesive Bonds." in: Annual Book of ASTM Standards. TA 455.A34 S83 1999.*

"Standard Test Method for Peel Resistance of Adhesives (T-Peel Test)." in: Annual Book of ASTM Standards. TP 967.A58 2001.*

"Appendix A" May 23, 2002, two pages.*

R. Lachance, et al: Corrosion/Migration Study of Flip Chip Underfill and Ceramic Overcoating, 1997.

Sumita K. et al. "High Reliability Underfill for Flip-Chip Application" 1997, Materials Research Society Symposium Proceedings XP-000912270 abstract.

* cited by examiner

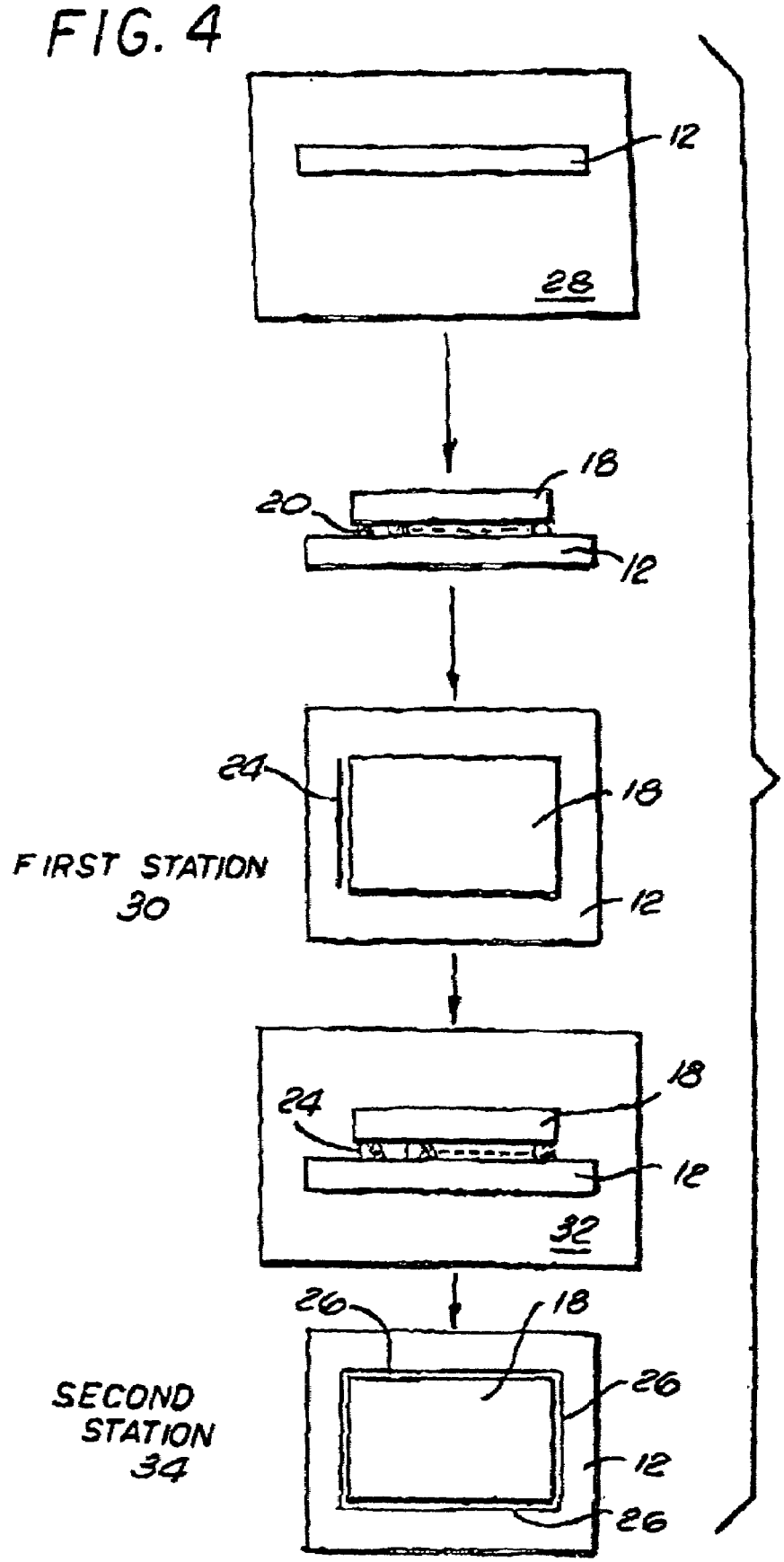

CONTROLLED COLLAPSE CHIP CONNECTION (C4) INTEGRATED CIRCUIT PACKAGE WHICH HAS TWO DISSIMILAR UNDERFILL MATERIALS

CROSS-REFERENCES TO RELATED APPLICATIONS

This Preliminary Amendment is filed concurrently with a Divisional Application under 37 C.F.R. §1.53(b). Applicants respectfully request the Examiner to examine these claims as now amended.

BACKGROUND OF THE INVENTION

1. Field of the Invention

The present invention relates to an integrated circuit package.

2. Background Information

Integrated circuits are typically assembled into a package that is soldered to a printed circuit board. FIG. 1 shows a type of integrated circuit package that is commonly referred to as flip chip or C4 package. The integrated circuit 1 contains a number of solder bumps 2 that are soldered to a top surface of a substrate 3.

The substrate 3 is typically constructed from a composite material which has a coefficient of thermal expansion that is different than the coefficient of thermal expansion for the integrated circuit. Any variation in the temperature of the package may cause a resultant differential expansion between the integrated circuit 1 and the substrate 3. The differential expansion may induce stresses that can crack the solder bumps 2. The solder bumps 2 carry electrical current between the integrated circuit 1 and the substrate 3 so that any crack in the bumps 2 may affect the operation of the circuit 1.

The package may include an underfill material 4 that is located between the integrated circuit 1 and the substrate 3. The underfill material 4 is typically an epoxy which strengthens the solder joint reliability and the thermo-mechanical moisture stability of the IC package.

The package may have hundreds of solder bumps 2 arranged in a two dimensional array across the bottom of the integrated circuit 1. The epoxy 4 is typically applied to the solder bump interface by dispensing a single line of uncured epoxy material along one side of the integrated circuit. The epoxy then flows between the solder bumps. The epoxy 4 must be dispensed in a manner that covers all of the solder bumps 2.

It is desirable to dispense the epoxy 4 at only one side of the integrated circuit to insure that air voids are not formed in the underfill. Air voids weaken the structural integrity of the integrated circuit/substrate interface. Additionally, the underfill material 4 must have good adhesion strength with both the substrate 3 and the integrated circuit 1 to prevent delamination during thermal and moisture loading. The epoxy 4 must therefore be a material which is provided in a state that can flow under the entire integrated circuit/substrate interface while having good adhesion properties.

The substrate 3 is typically constructed from a ceramic material. Ceramic materials are relatively expensive to produce in mass quantities. It would therefore be desirable to provide an organic substrate for a C4 package. Organic substrates tend to absorb moisture which may be released during the underfill process. The release of moisture during the underfill process may create voids in the underfill material. Organic substrates also tend to have a higher coefficient of thermal expansion compared to ceramic substrates that may result in higher stresses in the die, underfill and solder bumps. The higher stresses in the epoxy may lead to cracks during thermal loading which propagate into the substrate and cause the package to fail by breaking metal traces. The higher stresses may also lead to die failure during thermal loading and increase the sensitivity to air and moisture voiding. The bumps may extrude into the voids during thermal loading, particularly for packages with a relatively high bump density. It would be desirable to provide a C4 package that utilizes an organic substrate.

SUMMARY OF THE INVENTION

One embodiment of the present invention is an integrated circuit package which may include an integrated circuit that is mounted to a substrate. The package may further have a first underfill material and a second underfill material that are attached to the integrated circuit and the substrate.

BRIEF DESCRIPTION OF THE DRAWINGS

FIG. 4 is a schematic showing a process for assembling the integrated circuit package.

DETAILED DESCRIPTION OF THE INVENTION

Figure 1:
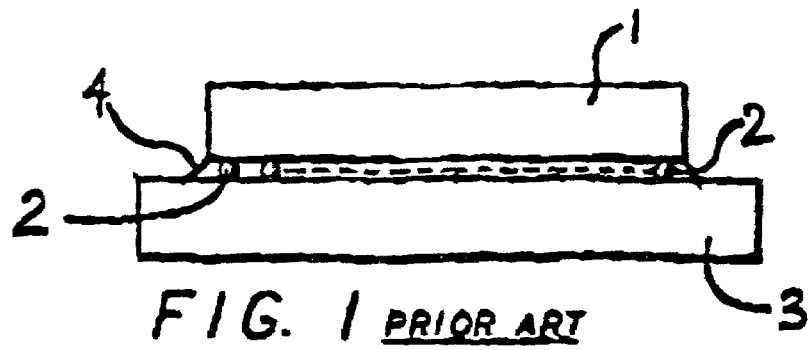
FIG. 1 is a side view of an integrated circuit package of the prior art.
Figure 2:
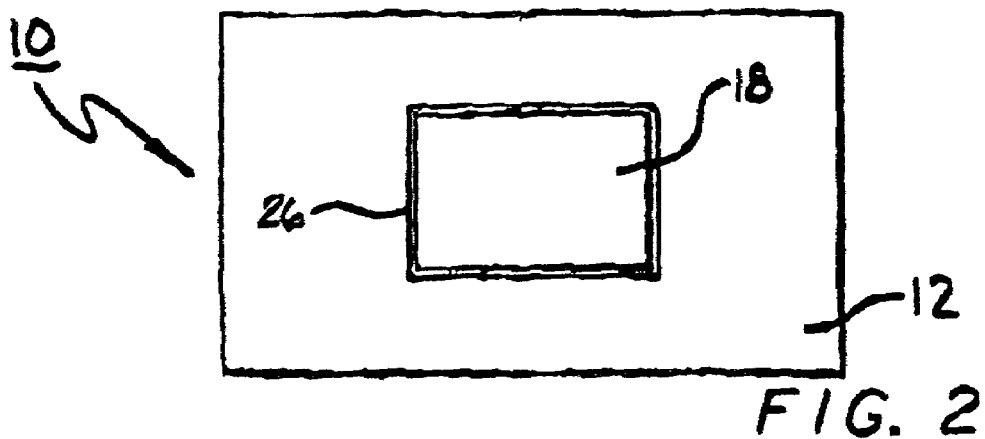
FIG. 2 is a top view of an embodiment of an integrated circuit package of the present invention.
Figure 3:
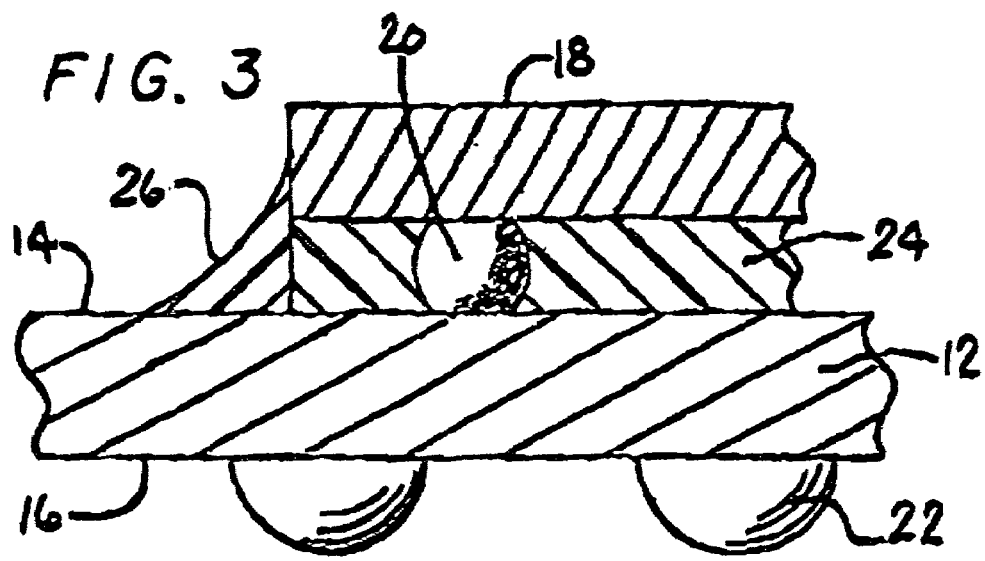
FIG. 3 is an enlarged side view of the integrated circuit package.

Referring to the drawings more particularly by reference numbers, FIGS. 2 and 3 show an embodiment of an integrated circuit package 10 of the present invention. The package 10 may include a substrate 12 which has a first surface 14 and a second opposite surface 16. An integrated circuit 18 may be attached to the first surface 14 of the substrate 12 by a plurality of solder bumps 20. The solder bumps 20 may be arranged in a two-dimensional array across the integrated circuit 18. The solder bumps 20 may be attached to the integrated circuit 18 and to the substrate 12 with a process commonly referred to as controlled collapse chip connection (C4).

The solder bumps 20 may carry electrical current between the integrated circuit 18 and the substrate 12. In one embodiment the substrate 12 may include an organic dielectric material. The package 10 may include a plurality of solder balls 22 that are attached to the second surface 16 of the substrate 12. The solder balls 22 can be reflowed to attach the package 10 to a printed circuit board (not shown).

The substrate 12 may contain routing traces, power/ground planes, vias, etc. which electrically connect the solder bumps 20 on the first surface 14 to the solder balls 22 on the second surface 16. The integrated circuit 18 may be encapsulated by an encapsulant (not shown). Additionally, the package 10 may incorporate a thermal element (not shown) such as a heat slug or a heat sink to remove heat generated by the integrated circuit 18.

The package 10 may include a first underfill material 24 that is attached to the integrated circuit 18 and the substrate 12. The package 10 may also include a second underfill material 26 which is attached to the substrate 12 and the integrated circuit 18. The second underfill material 26 may form a circumferential fillet that surrounds and seals the edges of the IC and the first underfill material 24. The sealing function of the second material 26 may inhibit moisture migration, cracking of the integrated circuit and cracking of the first underfill material.

The first underfill material 24 may be an epoxy produced by Shin-Etsu of Japan under the product designation SEMI-COAT 5230-JP™. The SEMICOAT 5230-JP™ material provides favorable flow and adhesion properties. The second underfill material 26 may be an anhydride epoxy produced by Shin-Etsu under the product designation SEMICOAT 122X™. The SEMICOAT 122X™ material has lower adhesion properties than the SEMICOAT 5230-JP™ material, but much better fracture/crack resistance.

FIG. 4 shows a process for assembling the package 10. The substrate 12 may be initially baked in an oven 28 in step 1 to remove moisture from the substrate material. The substrate 12 is preferably baked at a temperature greater than the process temperatures of the remaining underfill process steps to insure that moisture is not released from the substrate 12 in the subsequent steps. By way of example, the substrate 12 may be baked at 163 degrees centigrade (° C.).

After the baking process, the integrated circuit 18 may be mounted to the substrate 12. The integrated circuit 18 is typically mounted by reflowing the solder bumps 20.

The first underfill material 24 may be dispensed onto the substrate 12 along one side of the integrated circuit 18 at a first dispensing station 30. The first underfill material 24 may flow between the integrated circuit 18 and the substrate 12 under a wicking action. By way of example, the first underfill material 24 may be dispensed at a temperature between 110 to 120° C. There may be a series of dispensing steps to fully fill the space between the integrated circuit 18 and the substrate 12.

The package 10 may be moved through an oven 32 to complete a flow out and partial gel of the first underfill material 24. By way of example, the underfill material 24 may be heated to a temperature of 120-145° C. in the oven 32 to partially gel the underfill material 24. Partial gelling may reduce void formation and improve the adhesion between the integrated circuit 18 and the underfill material 24. The improvement in adhesion may decrease moisture migration and delamination between underfill material 24 and the IC 18 as well as delamination between underfill material 24 and the substrate. The reduction in void formation may decrease the likelihood of bump extrusion during thermal loading. The package may be continuously moved through the oven 32 which heats the underfill material during the wicking process. Continuously moving the substrate 12 during the wicking process decreases the time required to underfill the integrated circuit and thus reduces the cost of producing the package. The substrate 12 can be moved between stations 30 and 34 and through the oven 32 on a conveyer (not shown).

The second underfill material 26 may be dispensed onto the substrate 12 along all four sides of the integrated circuit 18 at a second dispensing station 34. The second material 26 may dispensed in a manner which creates a fillet that encloses and seals the first material 24. By way of example, the second underfill material 26 may be dispensed at a temperature of approximately 80 to 120° C.

The first 24 and second 26 underfill materials may be cured into a hardened state. The materials may be cured at a temperature of approximately 150° C. After the underfill materials 24 and 26 are cured, solder balls 22 may be attached to the second surface 16 of the substrate 12.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A process for underfilling an integrated circuit that is mounted to a substrate, comprising:
    dispensing a first material to form an underfill which becomes attached to the integrated circuit and the substrate; and,
    dispensing a second material to form a circumferential fillet, the second material being different than the first material and having a lower adhesive property than the first material and becoming attached to the integrated circuit and the substrate.

2. The process as recited in claim 1, wherein the first material flows between the integrated circuit and the substrate.

3. The process as recited in claim 2, wherein the substrate moves within an oven while the first material flows between the integrated circuit and the substrate.

4. The process as recited in claim 1, wherein the second material is dispensed in a pattern which surrounds the first material.

5. A process for underfilling an integrated circuit that is mounted to a substrate comprising:
    heating the substrate before a first material is dispensed;
    dispensing the first material to form an underfilling, the first material becoming attached to the integrated circuit and the substrate; and,
    dispensing a second material to form a circumferential fillet, the second material being different than the first material and having a lower adhesive property than the first material and becoming attached to the integrated circuit and the substrate.

6. The process as recited in claim 5, further comprising heating the first material to a gel state.

7. The process as recited in claim 6, wherein the substrate is heated to a temperature that is greater than a temperature for heating said first material to said gel state.

8. The process as recited in claim 5, further comprising mounting the integrated circuit to the substrate with a solder bump before the first material is dispensed.

9. A process for underfilling an integrated circuit that is mounted to a substrate comprising:
    heating the substrate before a first material is dispensed;
    dispensing the first material to form an underfill, the first material becoming attached to the integrated circuit and the substrate; and,
    dispensing a second material around a periphery of the integrated circuit to form a circumferential fillet, the second material being different than the first material and having a lower adhesion property than the first material and becoming attached to the integrated circuit and the substrate.

10. The process as recited in claim 9, further comprising heating the first material to a gel state.

11. The process as recited in claim 10, wherein the substrate is heated to a temperature that is greater than a temperature for heating the first material to a gel state.

12. The process as recited in claim 11, wherein the first material is heated to a temperature ranging between 120 degrees Celsius to 145 degrees Celsius.

13. The process as recited in claim 9, wherein the dispensing of the second material is at a temperature ranging between 80 degrees Celsius and 120 degrees Celsius.

* * * * *